United States Patent [19]
Sung et al.

(10) Patent No.: US 6,559,501 B2
(45) Date of Patent: May 6, 2003

(54) METHOD FOR FORMING SPLIT-GATE FLASH CELL FOR SALICIDE AND SELF-ALIGN CONTACT (75) Inventors: Hung-Cheng Sung, Hsin-chu (TW); Di-Son Kuo, Hsinchu (TW); Chia-Ta Hsieh, Tainan (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/850,639

(22) Filed: May 7, 2001

(65) Prior Publication Data
US 2001/0026968 A1 Oct. 4, 2001

Related U.S. Application Data (62) Division of application No. 09/213,453, filed on Dec. 17, 1998, now Pat. No. 6,284,596.

(51) Int. Cl.⁷ .............................................. H01L 29/788
(52) U.S. Cl. ....................................................... 257/316
(58) Field of Search ................................. 257/314, 315, 257/316

(56) References Cited

U.S. PATENT DOCUMENTS

| 5,045,488 A | 9/1991 | Yeh | 437/43 |
| 5,242,848 A | 9/1993 | Yeh | 437/43 |
| 5,597,751 A * | 1/1997 | Wang | 437/43 |
| 5,652,161 A | 7/1997 | Ahn | 437/43 |
| 5,674,767 A | 10/1997 | Lee et al. | 437/43 |
| 5,683,922 A | 11/1997 | Jeng et al. | 437/41 SM |
| 6,074,914 A * | 6/2000 | Ogura | 438/257 |
| 6,136,648 A * | 10/2000 | Oya | 438/257 |
| 6,274,489 B1 * | 8/2001 | Ono et al. | 438/659 |

* cited by examiner

Primary Examiner—David Nelms
Assistant Examiner—Quoc Hoang
(74) Attorney, Agent, or Firm—George O. Saile; Stephen B. Ackerman; Sergin Oktay (57) ABSTRACT A method is disclosed for forming a split-gate flash memory cell having a salicidated control gate and self-aligned contacts. Salicidation is normally performed with single gate devices, such as logic devices. In a split-gate where the control gate overlays the floating gate with an intervening intergate oxide layer, it is conventionally incompatible to form self-aligned silicides over the control gate due to its position at a different level from that of the floating gate. Furthermore, oxide spacers that are normally used are inadequate when applied to memory cells. It is shown in the present invention that by a judicious use of an additional nitride/oxide layer over the control gate, oxide spacers can now be used effectively to delineate areas on the control gate that can be silicided and also self-aligned. Hence, with this method, salicidation and self-aligned contact techniques can be used not only on the same VLSI and ULSI chips having both peripheral logic devices and memory devices, but also in memory devices themselves.

7 Claims, 4 Drawing Sheets

METHOD FOR FORMING SPLIT-GATE FLASH CELL FOR SALICIDE AND SELF-ALIGN CONTACT

This application is a division of application Ser. No. 09/213,453, filed Dec. 17, 1998, now U.S. Pat. No. 6,284,596.

BACKGROUND OF THE INVENTION

(1) Field of the Invention

The present invention relates to the manufacturing of semiconductor devices in general, and in particular, to a method of fabricating a split-gate flash memory cell having salicided control gate and self-aligned contact.

(2) Description of the Related Art

For complementary metal-oxide semiconductor (CMOS) technology with feature sizes less than 0.35 micrometer ($\mu$m), it is becoming more and more essential to employ salicidation processes in order to reduce the electrical resistance of device contacts which are dramatically shrinking in size. This follows from the well-known inverse-relationship of resistance to area. At the same time, and commensurate with the scaling down of very large scale (VLSI) and ultra scale integrated (ULSI) devices, it is also becoming essential to employ self-alignment process for forming contacts in the memory cells. Salicidation process is itself a self-aligned silicidation process as will be described below, and the self-aligned contact (SAC) of the memory cell has different requirements than the salicide contacts in the peripheral circuits of a semiconductor memory chip. The salicidation and the SAC processes are usually incompatible. However, a novel process is disclosed in the present invention where the two processes are successfully integrated. To help in the understanding of the invention, some memory cell types and the salicidation process will now be described.

Figure 1A:
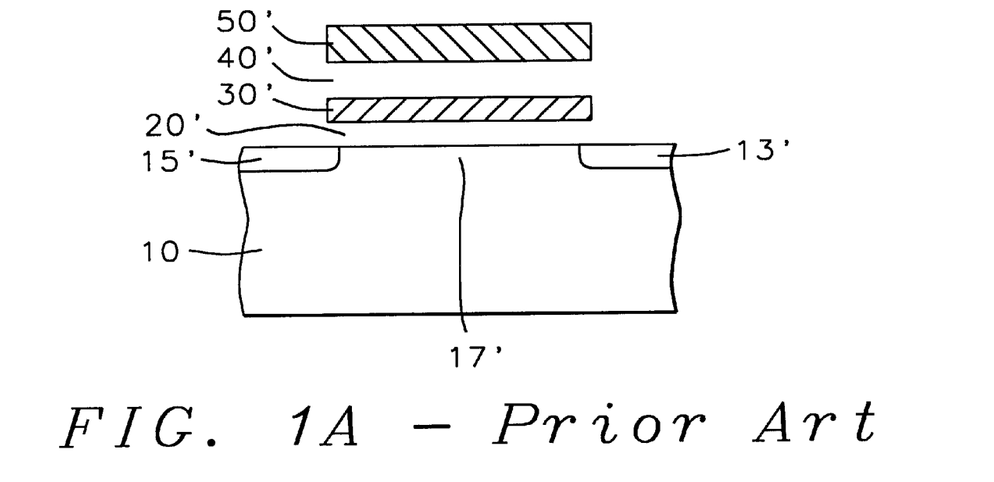
FIG. 1A is a partial cross-sectional view of a semiconductor substrate showing the forming of conventional stacked-gate memory cell.

Memory devices include electrically erasable and electrically programmable read-only memories (EEPROMs) of flash electrically erasable and electrically programmable read-only memories (flash EEPROMs). Generally, flash EEPROM cells having both functions of electrical programming and erasing may be classified into two categories, namely, a stack-gate structure and a split-gate structure. A conventional stack-gate type cell is shown in FIG. 1a where, as is well known, tunnel oxide film (20'), a floating gate (30'), an interpoly insulating film (40') and a control gate (50') are sequentially stacked on a silicon substrate (10) between a drain region (13') and a source region (15') separated by channel region (17'). Substrate (10) and channel region (17') are of a first conductivity type, and the first (13') and second (15') doped regions are of a second conductivity type that is opposite the first conductivity type.

One of the problems that is encountered in flash memory of FIG. 1a is the "over-erasure" of the cell contents during erasure operations. In FIG. 1a, the stacked-gate transistor is capable of injecting electrons from drain (13'), based on a phenomenon known as the Fowler-Nordheim Tunneling Effect, through tunneling oxide layer (20') into floating gate (30'). The threshold voltage of a stacked-gate transistor can be raised by means of such electron injection, and the device is then assumes a first state that reflect the content of the memory cell. On the other hand, during erasure of the memory cell, electrons are expelled from the source (15') through tunneling oxide layer (20') and out of floating gate (30') of the transistor. As a result of this electron removal, the threshold voltage is lowered and thus the device then assumes a second memory state.

During the process of memory content erasure, however, to ensure complete removal of the electrons previously injected, the erasure operation is normally sustained for a slightly prolonged time period. There are occasions when such a prolonged erasure operation results in the removal of excess electrons, i.e., more electrons than were previously injected. This results in the formation of electron holes in the floating gate of the device. In severe cases, the stacked-gate transistor becomes a depletion transistor, which conducts even in the absence of the application of a control voltage at the control gate, (50'). This phenomenon is known in the art as memory over-erasure.

Figure 1B:
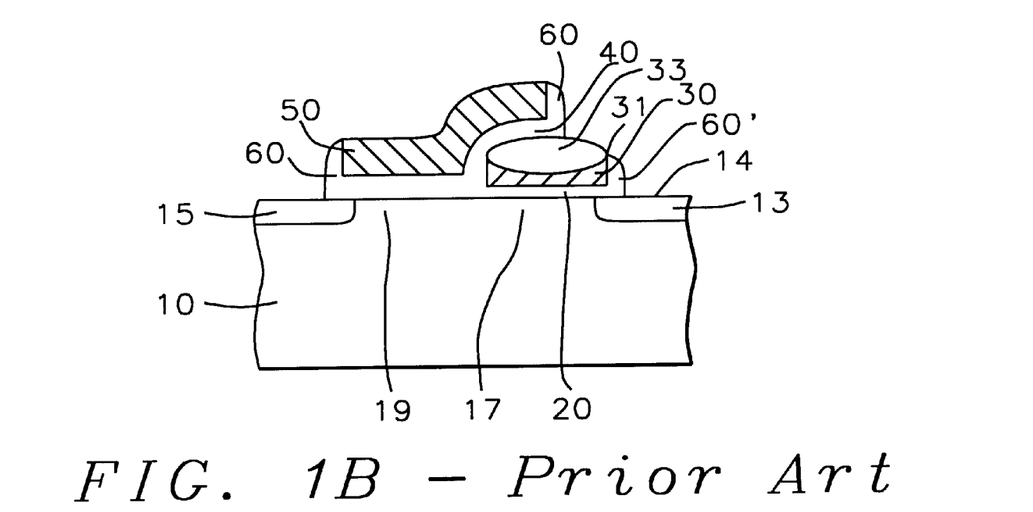
FIG. 1B is a partial cross-sectional view of a semiconductor substrate showing the forming of a conventional split-gate memory cell.

To overcome the described memory over-erasure problem of stacked-gate type EEPROM devices, a split-gate EEPROM device is used as shown in FIG. 1b. This memory device comprises floating-gate transistor which similarly includes control gate (50), floating gate (30) with an intervening interpoly oxide (40) as in the case of the stacked-gate transistor of FIG. 1a. As is usual, gate-oxide (20) separates the floating gate from the substrate. A poly-oxide layer (33) is also usually formed for use as a hard-mask in forming the floating gate (30). However, floating gate (30) here covers only a portion of the channel region, (17), and the rest of the channel region, (19), is directly controlled by control gate (50). This split-gate-based memory cell is equivalent to a series connected floating-gate transistor (17) and an enhanced isolation transistor (19), as is schematically represented in FIG. 1b. The principal advantage of such configuration is that isolation transistor (19) is free from influence of the state of floating gate (17) and remains in its off-state, even if floating-gate transistor (17) is subjected to the phenomenon of over-erasure and therefore, is in a conductive state. The memory cell can thus maintain its correct state irrespective of the over-erasure problem.

In the fabrication of a split-gate flash memory cell such as shown FIG. 1b, it would desirable to use a conventional salicide (self-aligned silicide) process for source/drain contact over regions (13) and/or (15). But that is not possible as will be explained later. The need for salicidation arises from the controlling effect that the physical structure and the electrical characteristics of gate electrode (30) have on the operation of the memory device. Its forming is usually complex and requires exacting processes. Furthermore, materials used for the gate must be compatible with processes that follow up to the completion of the manufacture of the semiconductor devices. With the advent of ULSI (ultra large scale integration) of devices, the shrinking dimensions of the gate as well as the materials used to form the gates have gained even more significance. Thus, if aluminum were to be used as the gate material for example, then, because of its low melting point, it would have to be deposited following the completion of all high-temperature process steps, including drive-in of the source and drain regions. To form the gate electrode in proper relationship to the source/drain, it must be separately aligned with respect to the source and drain. This alignment process adversely affects both packing density and parasitic overlay capacitances between the gate and source/drain regions. For these reasons, it has become a recent practice to use polycrystalline silicon (poly-Si), which has the same high melting point as the silicon substrate, as the gate material. Hence, polysilicon can now be deposited over the gate to form the gate electrode prior to the source and drain formation. Consequently, the gate itself can serve as a mask during formation of the source and drain regions by either diffusion or ion implantation, as is known in the art. Gate (30) thereby becomes nearly perfectly aligned over channel (17) and with respect to source (13) shown in FIG. 1b. The only overlap of the source and drain is due to lateral diffusion of the dopant atoms. This self-alignment feature simplifies the fabrication sequence, increases packing density, and reduces the gate-source and gate-drain parasitic overlap capacitances. For completeness, we note that the threshold voltage, $V_{th}$, of MOS device is also favorably affected by the use of polysilicon as the gate electrode material.

On the other hand, polysilicon has much higher electrical resistance as compared to aluminum, for example, and the miniaturization of devices in the ULSI era has exacerbated the electrical properties of the poly-Si gate electrode. Polysilicon is commonly doped by ion implantation to lower the resistivity substantially. However, it is known that polysilicon film has a sheet resistance which is about two orders of magnitude larger than that of aluminum film of the same thickness. The resulting high values of line resistance can lead to long propagation delays and severe dc voltage variations within an ULSI circuit.

In order to overcome the high resistivity problem encountered with polysilicon alone, polycides, a multilayer structure comprising polysilicon and metal silicides are used to form gate electrodes. Silicides are a group of refractory metal compounds ($MSi_x$) that are formed by basically three techniques, each of which involves deposition followed by a thermal step to form the silicide: 1) deposition of a pure metal such as tungsten (W), titanium (Ti) or Molybdenum (Mo) on polysilicon, 2) simultaneous evaporation of the silicon and the refractory metal from two sources, and 3) sputter-depositing the silicide itself from a composite target, or by co-sputtering or layering.

In a salicide process, after the polysilicon layers have been deposited and patterned, sidewall spacers (60) are formed. This is accomplished by depositing a layer of oxide (not shown) which conformally covers the polysilicon layers. The oxide layer is then etched back anisotropically until the upper polysilicon layer is exposed. Unetched portions of the oxide at the vertical sides of the polysilicon layers remain following this etch. These residual structures then form the oxide spacers (60) and (60') shown in FIG. 1b. As practiced conventionally, the metal used to form the silicide (not shown) is deposited and the substrate is next heated, which causes the silicide reaction to occur wherever the metal is in contact with the silicon. Everywhere else, the metal remains unreacted. The unreacted metal at places such as over the spacers is selectively removed through the use of an etchant that does not attack the silicide, the silicon substrate, or the oxide. As a result, in addition to the polysilicon layer, only each exposed source and region is now completely covered by silicide film (not shown) but no other place.

As is well known in the art, the purpose of the spacers is to prevent shorting between metal deposited subsequently on the gate and on the source/drain regions. However, in the split-gate flash memory cell of FIG. 1b, the resulting spacer (60') next to the floating gate is usually thinner than elsewhere. During the etching of the sidewall spacer, a portion (31) of the floating gate becomes exposed, i.e., the conductive polycrystalline silicon exposed from under the poly-oxide (33). As is commonly practiced in prior art and as explained by Wang in U.S. Pat. No. 5,597,751, an acid dip may be required to remove residual oxide in the silicide area prior to the formation of the salicide layer. The portion (31) of floating gate (30) is therefore exposed more and more. This process leads to the formation of a silicide bridge (or a short circuit) between the floating gate (30) at portion (31) and contact area (14) over source region (13). Hence, salicide process cannot be used successfully.

Salicide and SAC processes are incompatible when used on the same VLSI or ULSI chip where both logic and memory devices are formed. For example, a dynamic random access memory (DRAM) or nonvolatile electrically programmable read only memory (EEPROM), or other similar memory devices are composed of an array of memory cells for storing digital information, while the peripheral circuits on these devices are typically composed of logic circuits for addressing the memory cells, while other peripheral circuits function as read/write buffers and sense amplifiers. Just as salicide and SAC processes are incompatible when used on the same VLSI or ULSI chips where both logic and memory devices are formed, they are especially incompatible when an attempt is made to use them in the same memory cell itself. This is primarily due to the upper level position of the control gate relative to the floating gate of a memory cell where delineation of the silicide area is difficult, as will be seen later in the embodiments of the invention. The present invention discloses an integrated method of using salicide and SAC processes in order to affect scaling down of integrated circuit technology without the aforesaid problems.

In related art, Wang of U.S. Pat. No. 5,597,751 discloses an oxide sealed salicide process to alleviate the problem of bridging in EPROMs. Lee, et al., in U.S. Pat. No. 5,674,767 disclose a method of manufacturing a nonvolatile memory device having a self-aligned structure by initially forming a semiconductor pattern and then removing it at a judiciously chosen process step so that the underlying region becomes the self-aligned source of the split-gate flash memory device. Jeng, et al., in U.S. Pat. No. 5,683,922 use a planarization process that fills a trench between the gates in fabricating a self-aligned contact. A self-aligned ion-implantation method is used by Yeh of U.S. Pat. No. 5,242,848 for making a split-gate single transistor nonvolatile electrically alterable semiconductor memory cell. Yeh also discloses in U.S. Pat. No. 5,045,488 another method of making an electrically programmable and erasable memory device having a re-crystallized floating gate. Ahn of U.S. Pat. No. 5,652,161, on the other hand, discloses a method of making split gate flash EEPROM cell by providing a thick insulating film to prevent degradation of the tunnel oxide film of the cell.

Thus, prior art provides methods of forming salicides and SACs. The present invention discloses a process where the two methods can be successfully integrated in the manufacturing of split-gate flash memory devices.

SUMMARY OF THE INVENTION

It is therefore an object of the present invention to provide a novel split-gate flash cell for salicide and self-align contact (SAC).

It is another object of the present invention to provide a method of forming salicided control gate and SAC.

It is yet another object of the present invention to provide a method of forming an upper level oxide layer in conjunction with oxide spacers to form a salicidated control gate in a split-gate flash memory cell.

These objects are accomplished by providing a semiconductor substrate having active and passive region defined; forming a gate oxide layer on said semiconductor substrate; forming a first polysilicon layer over said gate oxide layer; forming a nitride layer over said first polysilicon layer; forming a first photoresist mask having floating gate pattern over said nitride layer; etching through said floating gate pattern in said first photoresist mask to form openings in said nitride layer and exposing said first polysilicon layer at the bottom of said openings; removing said first photoresist mask; oxidizing said exposed first polysilicon layer at the bottom of said openings in said nitride layer to form poly-oxide; removing said nitride layer; using said poly-oxide as a hard-mask, etching said first polysilicon layer to form a floating gate underlying said poly-oxide layer; forming an interpoly oxide layer over said substrate; forming a second polysilicon layer over said interpoly oxide layer; ion implanting said second polysilicon layer; forming an oxide layer over said second polysilicon layer; forming a partial hard photomask over said oxide layer having open pattern over gate region; etching through said open pattern in said partial hard mask to remove portions of said oxide layer exposed in said open pattern; removing said partial hard photomask; forming a second photoresist mask having control gate pattern over said second polysilicon layer; etching through pattern in said second photoresist mask to form a control gate; performing ion implantation to form source region; forming nitride spacer; performing ion implantation to form drain region; depositing a resistor protecting oxide (RPO) layer over said substrate; etching said RPO to form openings over gate and contact surfaces of substrate where salicidation is to be performed; performing salicidation in said openings; forming an interlevel dielectric layer (ILD) over said substrate; forming a third photoresist mask having self-aligned contact pattern over said ILD; etching through said pattern in said third photoresist mask to form self-aligned contact opening in said ILD layer; forming metal in said self-aligned contact openings and performing etch back to complete the forming of said split-gate having salicidated gate and self-aligned contacts.

BRIEF DESCRIPTION OF THE DRAWINGS

In the accompanying drawings, similar numerals refer to similar parts throughout the several views.

DESCRIPTION OF THE PREFERRED EMBODIMENTS

Referring now to the drawings, in particular to FIGS. 2A through 2I there is shown a method of forming salicidated gates and self-aligned contacts for a split-gate flash memory cell. The same figures also disclose a split-gate cell structure having salicidated gate and self-aligned contacts. The main feature of the present invention is the salicidated gate structure in a memory cell and the forming thereof.

Figure 2A:
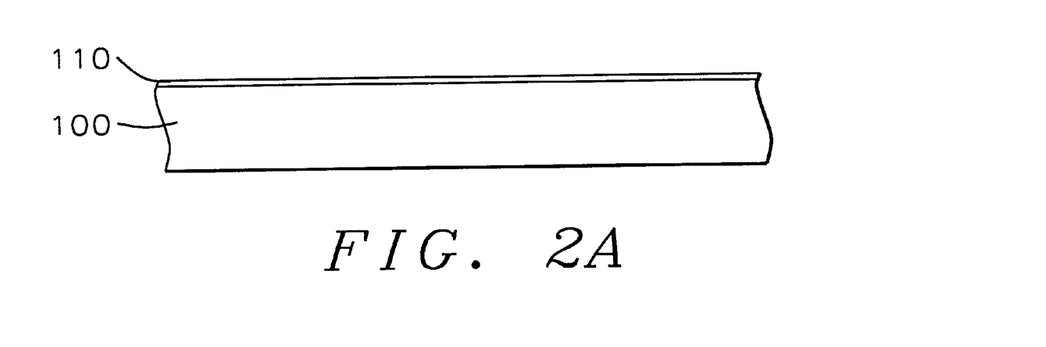
FIG. 2A is a partial cross-sectional view of a semiconductor substrate showing the forming of floating gate oxide of this invention.

FIG. 2A shows a cross-sectional view of a semiconductor substrate (100) provided with a conventional substructure having active and passive regions. The forming of this substructure is not essential to the understanding of the present invention, and therefore, the details will not be given here so as to not obscure the key aspects of the invention. A gate oxide layer (110) is formed over substrate (100) as shown in FIG. 2A. Preferably, it is grown thermally in dry oxygen in an oxidation furnace at temperature range between about 800 to 900° C., and to a thickness between about 80 to 100 Å. Alternatively, other oxidation methods can be used, such as oxidation in a dry oxygen and anhydrous hydrogen chloride in atmospheric or low pressure environment, or low temperature, high-pressure, and the like.

Figure 2B:
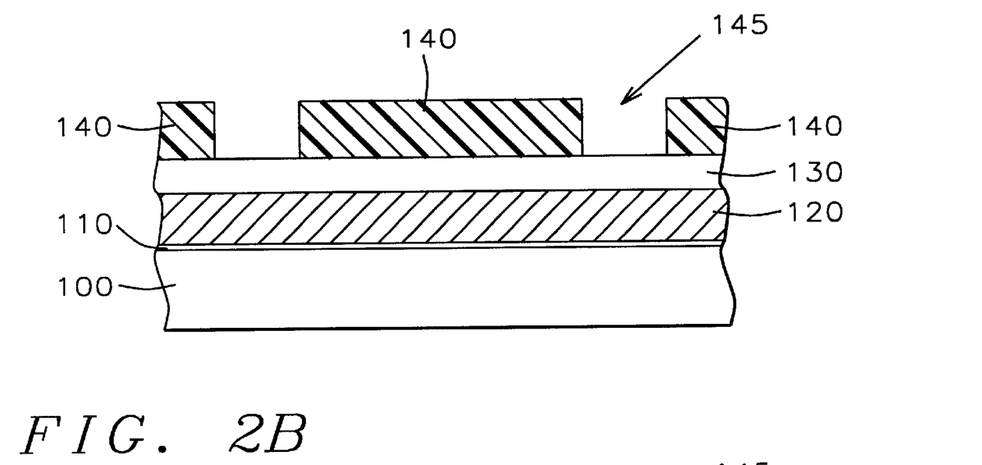
FIG. 2B is a partial cross-sectional view of the same semiconductor substrate of FIG. 2A showing the forming of the first polysilicon layer followed by the forming of a nitride layer and a photoresist mask, according to this invention.

A first polysilicon layer (120) is next formed over gate oxide layer (110) through methods including but not limited to Low Pressure Chemical Vapor Deposition (LPCVD), Chemical Vapor Deposition (CVD) and Physical Vapor Deposition (PVD) sputtering methods employing suitable silicon source materials, preferably formed through a LPCVD method employing silane $SiH_4$ as a silicon source material at a temperature range between about 550 to 650° C. The preferred thickness is between about 1000 to 1500 angstroms (Å). This is followed by the deposition of a layer of nitride (130) to a thickness between about 800 to 1200 Å. Then, a first photoresist layer (140) is deposited and formed into a photomask having patterns corresponding to the floating gates to be formed, as shown in FIG. 2B. Subsequently, patterns (145) in the photomask are transferred into the nitride layer by etching the nitride with a recipe comprising gases $O_2$, $SF_6$ and, afterwards, photomask (140) is removed by employing oxygen plasma ashing.

Figure 2C:
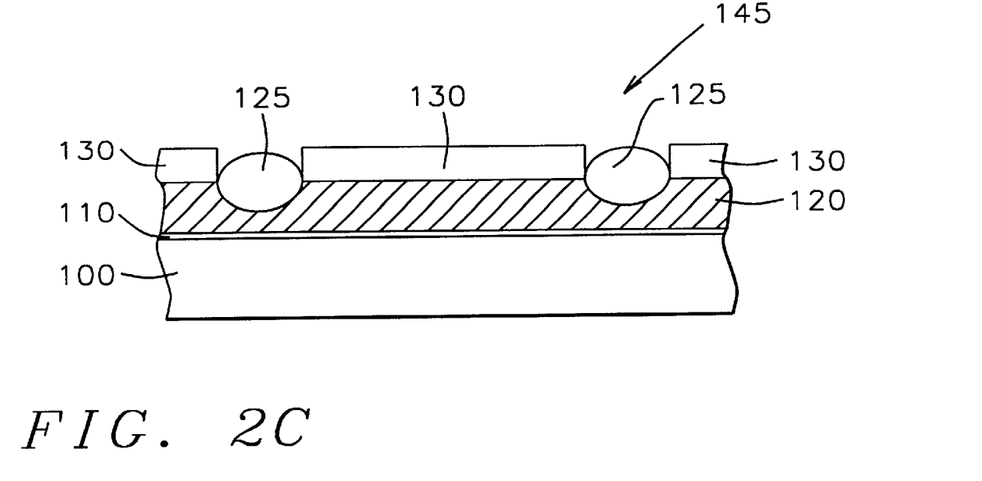
FIG. 2C is a partial cross-sectional view of the same semiconductor substrate of FIG. 2B showing the forming of the poly-oxide of this invention.
Figure 2D:
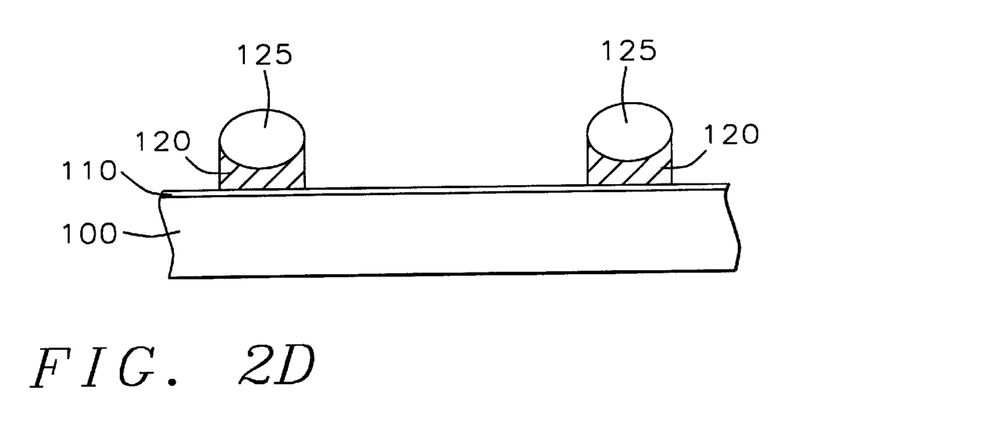
FIG. 2D is a partial cross-sectional view of the same semiconductor substrate of FIG. 2C showing the forming of the floating gate of this invention.

The portions of the first polysilicon layer that are exposed at the bottom of pattern openings (145) in the nitride layer are next oxidized by wet oxidation at a temperature between about 800 to 900° C. forming poly-oxide (125) as shown in FIG. 2C. The nitride layer is then removed by applying a wet solution of phosphoric acid, $H_3PO_4$. Using poly-oxide (125) as a hard-mask, the first polysilicon layer is etched down to the gate oxide layer, thus forming floating gate (120) as shown in FIG. 2D. The etching of the polysilicon layer is accomplished by using anisotropic plasma etching, for example in a reactive ion etcher (RIE), and using an etchant gas such as hydrogen bromide (HBr), or chlorine ($Cl_2$) and a carrier gas, such as argon (Ar), and it is preferred that gases $SF_6$ and HBr be used. This results in the selective etching of the polysilicon layer (120) to the gate oxide (110).

Figure 2E:
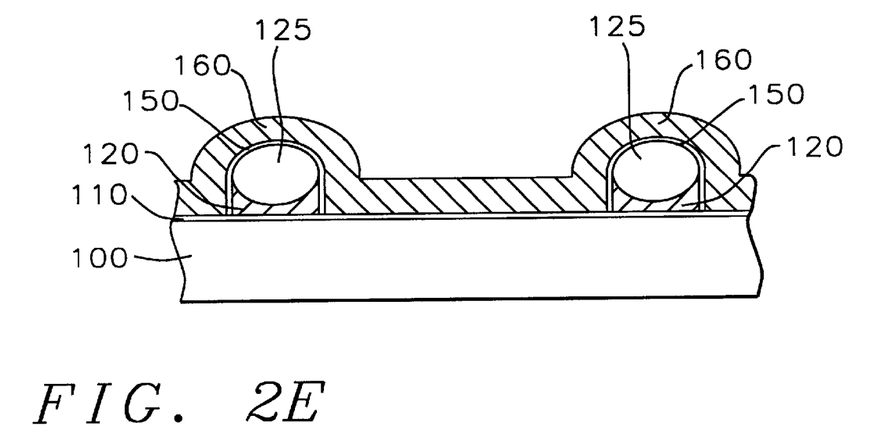
FIG. 2E is a partial cross-sectional view of the same semiconductor substrate of FIG. 2D showing the forming of an inter-gate oxide layer followed by the forming of a second polysilicon layer, according to this invention.
Figure 2F:
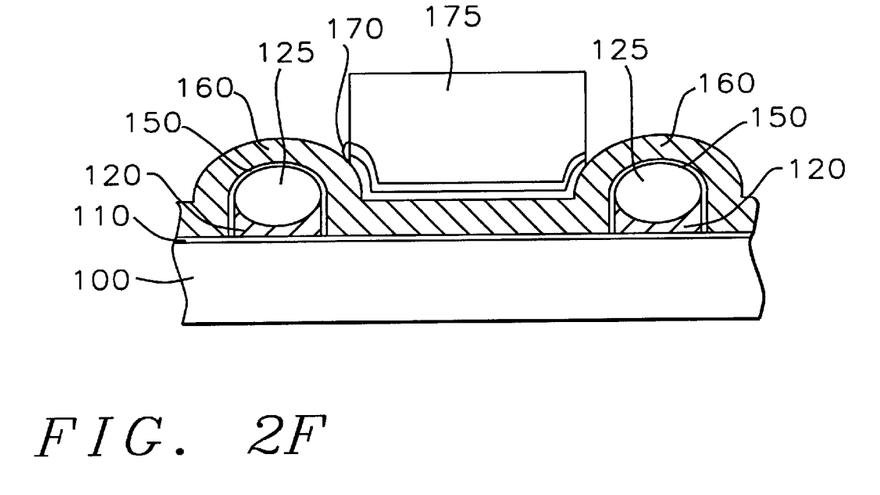
FIG. 2F is a partial cross-sectional view of the same semiconductor substrate of FIG. 2E showing the forming of an upper level oxide layer and the partial etching of the same with the use of a partial hard mask.

Referring now to FIG. 2E, after the forming of the floating gate, (120), a conformal oxide layer (150) is formed, where this layer will serve as an interpoly oxide between the first polysilicon layer and the second polysilicon layer to be deposited. It is preferred that interpoly layer (150) comprises oxide and is chemical vapor deposited by reacting $SiH_2Cl_2$ and $N_2O$ to a thickness between about 150 to 250 Å. The second polysilicon layer, referenced as numeral (160) in FIG. 2E is next deposited over the interpoly oxide using LPCVD similar to the deposition for the first polysilicon layer having a thickness between about 1500 to 2500 Å. Polysilicon layer (160) is also doped by ion implantation using arsenic ($As^{75}$) or phosphorous ($P^{31}$) ions and it is preferred that ($P^{31}$) be used. Alternatively, the polysilicon can be doped in-situ by adding a dopant gas, such as phosphine ($PH_3$) to the chemical vapor deposited (CVD) reactant gas silane At the next important step, conformal layers of oxide and nitride are deposited over second polysilicon layer (160) and then etched using a partial hard mask (175) as shown in FIG. 2F. This layer (170) of nitride/oxide, which is shown only partially after the etch, is important because it will serve as a wall which will accept oxide spacers that are to be formed later, which in turn will delineate the area over the second polysilicon control gate that will be salicidated. The preferred thickness of both the oxide and nitride layers (170) is between about 1000 to 2000 Å. The partial hard mask (175) which is patterned with openings over the second polysilicon layer (160) comprises photoresist. The etching of the nitride/oxide layer through the openings of the partial hard mask is accomplished with a recipe comprising $SF_6$, $CF_4$, $CHF_3$. After the etching of the nitride/oxide layer (170) as shown in FIG. 2F, the partial hard mask is removed with $H_2SO_4$ and $H_2O_2$.

Figure 2G:
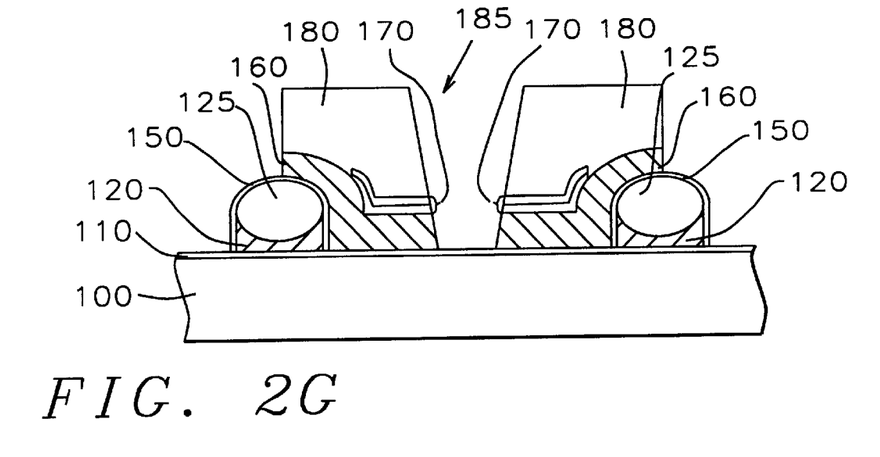
FIG. 2G is a partial cross-sectional view of the same semiconductor substrate of FIG. 2F showing the forming of the control gate and the contact of this invention.
Figure 2H:
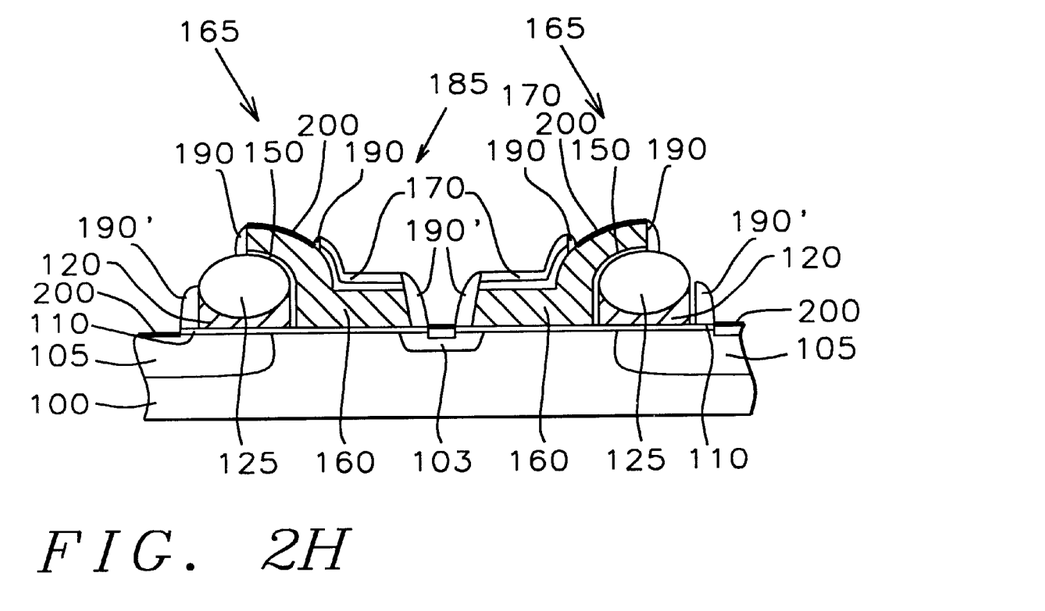
FIG. 2H is a partial cross-sectional view of the same semiconductor substrate of FIG. 2G showing the forming oxide spacers adjacent to the upper level oxide layer of this invention and the silicidation of the areas delineated by the oxide spacer, including that of a portion of the control gate and the silicon substrate contact area, according to this invention.
Figure 2I:
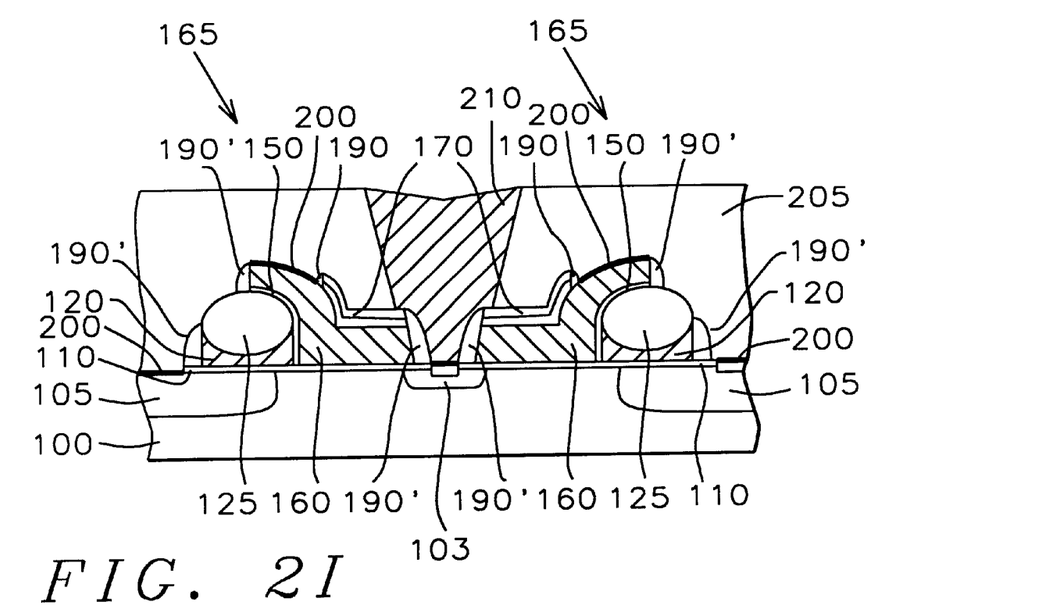
FIG. 2I is a partial cross-sectional view of the same semiconductor substrate of FIG. 2H showing the forming of the interlevel dielectric layer, and the metallization of the self-aligned contact of this invention.

A second photoresist mask (180) having patterns corresponding to the control gates and contact areas over the substrate is formed as shown in FIG. 2G. The underlying layers of oxide (170) and second polysilicon layer (160), including the inter-gate oxide layer (150) are then etched leaving polysilicon portions (165) of the control gate exposed, as shown in FIG. 2H. The etching is accomplished with a recipe comprising $SF_6$, $CF_4$, $CHF_3$ and HBr. The second photoresist mask is removed by oxygen plasma ashing.

As another important step of the present invention, oxide spacers (190) are formed as shown in FIG. 2H. The forming of the spacers is accomplished by depositing and anisotropically etching an oxide layer (not shown) having a thickness between about 1500 to 2500 Å. As is known in the art, because of its directionality, anisotropic etching leaves portions of the oxide attached to the vertical sidewalls of the polysilicon gates, and in this instance, also on the vertical walls of the oxide layer (170) which was deposited for this purpose at an earlier step. The anisotropic etching is accomplished with a recipe comprising $CF_4$, $CHF_3$, Ar. This etching also removes the gate oxide layer in contact openings (185) shown in FIG. 2H. At the same time that the novel upper level oxide spacers (190) so formed adjacent to layer (170) can be used in the next step to define the silicidation area over the control gate, the lower level spacers (190') can now be used to form the self-aligned source and drain regions, (105) and (103), respectively, as shown in FIG. 2H. A source implant, comprising gas phosphorous is used at a dosage level between about $2\times10^{15}$ to $5\times10^{15}$ atoms/cm² and energy level between about 40 to 60 KeV, while arsenic is used as a drain implant at a dosage level between about $4\times10^{15}$ to $5\times10^{15}$ atoms/cm² and energy level between about 40 to 60 KeV.

As a main feature and key aspect of the present invention, a layer of suicide, (200) is formed everywhere (not shown) on the substrate of FIG. 2H covering the regions bounded by the oxide spacers, such as region (165) over control gate (160), as well. That is, the salicided regions (165) cover only a portion of control gate (160) and source/drain regions such that the salicided regions covering the portion of the control gate and the source/drain regions are separated from each other by oxide spacers (170), (190) and (190'). It will be noted that the salicided region covering the control gate overlaps only the underlying floating gate and not the whole body of the control gate, as seen in the same FIG. 2H. It is preferred in this embodiment that titanium suicide (TiSi) be sputter deposited to a thickness between about 300 to 400 Å and heated to a temperature between about 700 to 800° C. Following the suicide formation, a selective etch, preferably etchant $NH_4OH$, removes the unreacted TiSi portions from non-silicon areas, such as from over spacers (190), oxide layer (170) while leaving the reacted portions (200) on the polysilicon control gate and over the source/drain portions on the silicon substrate as shown in FIG. 2H. Hence, the main objective of forming salicided control gate has been accomplished. Also, it will be noted that the silicides so formed are self-aligned with respect to the gates, hence are salicides.

It will be noted in FIG. 2H that with the presence of oxide layer (170) and oxide spacers (190), the usual problem of bridging is alleviated. Furthermore, using the disclosed method, a salicide, that is, self-aligned silicide contact can be used for both gates and contacts.

Substrate (100) is next deposited with an interlevel dielectric layer (205). Blanket dielectric layers may be formed from materials including but not limited to silicon oxide materials, silicon nitride materials, and silicon oxides materials formed within integrated circuits through methods including but not limited do CVD, PECVD, PVD sputtering methods. For the preferred embodiment of the present invention, the blanket dielectric layer (205) is preferably formed of a dielectric material chosen from the group of dielectric materials consisting of silicon oxide dielectric materials, silicon nitride, and silicon oxide and has a thickness between about 1000 to 1500 Å.

Dielectric layer (205) is next etched to form contact hole (210). The etch is performed with a recipe comprising $C_4F_8$, CO, $O_2$, $CHF_3$. Subsequent to the forming of the contact hole, (210), the usual back-end processes of semiconductor manufacturing, such as forming of the various metallized layers, are continued to completion. It is preferred that tungsten metal be used in contact (210) shown in FIG. 2I.

While the invention has been particularly shown and described with reference to the preferred embodiments thereof, it will be understood by those skilled in the art that various changes in form and details may be made without departing from the spirit and scope of the invention.

What is claimed is:

1. A split-gate flash memory cell for salicide and self-align contact comprising:

providing a semiconductor substrate having active and passive region defined;

a gate oxide layer covering said substrate;

a poly-oxide layer formed overlying a floating gate formed over said gate oxide;

an inter-gate oxide layer covering said poly-oxide layer;

a control gate formed over said inter-gate oxide layer;

a salicidated surface on that portion of said control gate overlapping said floating gate;

oxide spacer formed at the sidewalls of said floating gate and said control gate;

a salicidated surface on said substrate; and a self-aligned opening and contact formed over said salicidated surface on said substrate.

2. The split-gate flash memory cell of claim 1, wherein said floating gate oxide layer has a thickness between about 80 to 100 Å.

3. The split-gate flash memory cell of claim 1, wherein said inter-gate oxide layer has a thickness between about 150 to 250 Å.

4. The split-gate flash memory cell of claim 1, wherein said salicidated surface on said control gate is formed by depositing titanium silicide and heating said substrate to a temperature between about 700 and 800° C.

5. The split-gate flash memory cell of claim 1, wherein said oxide spacer has a thickness between about 1500 to 2500 Å.

6. The split-gate flash memory cell of claim 1, wherein said salicidated surface on said substrate is formed by depositing titanium silicide and heating said substrate to a temperature between about 700 and 800° C.

7. The split-gate flash memory cell of claim 1, wherein said self-aligned opening is filled with tungsten metal to from a self-aligned contact.

* * * * *

UNITED STATES PATENT AND TRADEMARK OFFICE
CERTIFICATE OF CORRECTION

PATENT NO.    : 6,559,501 B2
DATED         : May 6, 2003
INVENTOR(S)   : Hung-Cheng Sung, Di-Son Kuo, Chia-Ta Hsieh It is certified that error appears in the above-identified patent and that said Letters Patent is hereby corrected as shown below:

<u>Title page,</u>
Item [74], delete "Sergin Oktay", and replace with -- Sevgin Oktay --.

Signed and Sealed this

First Day of July, 2003

JAMES E. ROGAN
*Director of the United States Patent and Trademark Office*